United States Patent
Pradeep et al.

(10) Patent No.: US 6,251,764 B1
(45) Date of Patent: Jun. 26, 2001

(54) METHOD TO FORM AN L-SHAPED SILICON NITRIDE SIDEWALL SPACER

(75) Inventors: Yelehanka Ramachandramurthy Pradeep; Jie Yu; Guan Ping Wu, all of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/439,368

(22) Filed: Nov. 15, 1999

(51) Int. Cl.[7] ................................................ H01L 21/3205
(52) U.S. Cl. ............................................................ 438/595
(58) Field of Search .................................. 438/595, 696, 438/701, 712, 724

(56) References Cited

U.S. PATENT DOCUMENTS

| | | | |
|---|---|---|---|
| 5,605,864 | 2/1997 | Prall | 437/195 |
| 5,643,824 | * 7/1997 | Chien et al. | 437/69 |
| 5,728,596 | 3/1998 | Prall | 437/52 |
| 5,858,865 | 1/1999 | Juengling et al. | 438/585 |
| 5,899,747 | * 5/1999 | Wu et al. | 438/704 |

* cited by examiner

Primary Examiner—David Nelms
Assistant Examiner—Quoc Hoang
(74) Attorney, Agent, or Firm—George O. Saile; Rosemary L. S. Pike

(57) ABSTRACT

A new method of forming silicon nitride sidewall spacers has been achieved. This method is used to fabricate tapered, L-shaped spacer profiles using a two-step etching process that can be performed insitu. In accordance with the objects of this invention, a new method of forming silicon nitride sidewall spacers has been achieved. An isolation region is provided overlying a semiconductor substrate. Conductive traces are provided overlying the insulator layer. A liner oxide layer is deposited overlying the conductive traces and the insulator layer. A silicon nitride layer is deposited overlying the liner oxide layer. The silicon nitride layer is anisotropically etched down to reduce the vertical thickness of the silicon nitride layer while not exposing the underlying liner oxide layer. The silicon nitride layer is etched through to form silicon nitride sidewall spacers adjacent to the conductive traces. This etching through results in a tapered, L-shaped sidewall profile, and the integrated circuit device is completed.

20 Claims, 4 Drawing Sheets

METHOD TO FORM AN L-SHAPED SILICON NITRIDE SIDEWALL SPACER

BACKGROUND OF THE INVENTION (1) Field of the Invention

The invention relates to a method of fabricating semiconductor structures, and more particularly, to a method of forming a silicon nitride, L-shaped, sidewall spacer in the manufacture of integrated circuit devices.

(2) Description of the Prior Art

Sidewall spacers are used in semiconductor manufacturing. These spacers protect underlying features during processing steps. In particular, silicon nitride sidewall spacers adjacent to transistor gate electrodes are used as masks to protect underlying source and drain regions during doping or implanting steps. As the physical geometry of semiconductor devices shrinks, the spacing between the gate electrodes becomes smaller and smaller.

Referring now to FIG. 1, a cross-section of a partially completed prior art integrated circuit device is shown. A semiconductor substrate 10 is shown. Two transistor gate electrodes 22 are formed overlying the semiconductor substrate 10. The transistor gate electrodes 22 comprise a polysilicon gate layer 18 overlying a gate oxide layer 14. A liner oxide layer 26 is deposited or grown overlying the transistor gate electrodes 22 and the semiconductor substrate 10. A silicon nitride layer 30 is deposited overlying the liner oxide layer 26.

Referring now to FIG. 2, a conventional silicon nitride spacer etch is performed. Sidewall spacers are formed by this etching step. Note the profile 34 or shape of the spacers. The spacer width at the top is only slightly less than the spacer width at the bottom. Where adjacent transistor gates are very narrowly spaced, it may be difficult to fill the gap between these spacers with a dielectric layer. The nearly vertical profile of the spacers may cause voids to form in the dielectric material if the transistor gates are too narrowly spaced.

Referring to FIG. 3, a second prior art example is shown. A semiconductor substrate 40 is provided. Two transistor gate electrodes 52 are formed overlying the semiconductor substrate 40. The transistor gate electrodes 52 comprise a polysilicon gate layer 48 overlying a gate oxide layer 44. A liner oxide layer 56 is deposited overlying the transistor gate electrodes 52 and the semiconductor substrate 40. A silicon nitride layer 60 is deposited overlying the liner oxide layer 56. A second silicon dioxide layer 64 is deposited overlying the silicon nitride layer 60.

Referring now to FIG. 4, a two-layer spacer etch is performed on the device. The second silicon dioxide layer 64 is anisotropically etched to create a rounded spacer profile 68. Here, we see how it is easier to achieve good spacer profiles when using silicon dioxide rather than silicon nitride. The silicon nitride layer 60 is etched through to separate spacers.

Referring now to FIG. 5, a post-etch wet chemical clean is performed. Here, the disadvantage of the additional silicon dioxide layer is apparent. The wet chemical clean removes a portion of the second silicon dioxide layer 64. The resulting profile 64 is shown. This two layer spacer process has four significant problems. First, two layers must be deposited and the total thickness of the two layers limits the spacing of the transistor gates. Second, the spacer etch is more complicated because two different materials must be etched. Third, the final shape of the spacers depends on post-etch chemical cleans. This is especially true if hydrofluoric acid (HF) is used in the post-etch clean. Fourth, the addition of the second silicon dioxide layer adds to the thermal budget of the process. This is significant because this layer would be added following the implantation of the lightly-doped drain regions of the transistors. The additional thermal cycle can change device performance.

Several prior art approaches disclose methods to form and fabricate sidewall spacers. U.S. Pat. No. 5,728,596 to Prall teaches the formation of a spacer layer that is used in forming buried contacts. U.S. Pat. No. 5,858,865 to Juengling et al discloses a spacer etch to facet the corners of the silicon nitride. This is used in the formation of contact plugs. U.S. Pat. No. 5,605,864 to Prall teaches a process to form a removable spacer that is used to improve the buried contact process. Co-pending U.S. patent application Ser. No. 09/439,368 (CS-99-063) to Y. Pradeep et al filed on Nov. 15, 1999 teaches a method of using oxidized silicon overlying nitride to form L-shaped spacers.

SUMMARY OF THE INVENTION

A principal object of the present invention is to provide an effective and very manufacturable method of fabricating silicon nitride sidewall spacers in the manufacture of integrated circuits.

A further object of the present invention is to provide a method to fabricate silicon nitride sidewall spacers with L-shaped profiles that improve dielectric material gap fill.

Another further object of the present invention is to provide a method to fabricate L-shaped silicon nitride sidewall spacers without adding a silicon dioxide layer overlying the silicon nitride.

In accordance with the objects of this invention, a new method of forming silicon nitride sidewall spacers has been achieved. An isolation region is provided overlying a semiconductor substrate. Conductive traces are provided overlying the insulator layer. A liner oxide layer is deposited overlying the conductive traces and the insulator layer. A silicon nitride layer is deposited overlying the liner oxide layer. The silicon nitride layer is anisotropically etched down to reduce the vertical thickness of the silicon nitride layer while not exposing the underlying liner oxide layer. The silicon nitride layer is etched through to form silicon nitride sidewall spacers adjacent to the conductive traces. This etching through results in a tapered, L-shaped sidewall profile, and the integrated circuit device is completed.

BRIEF DESCRIPTION OF THE DRAWINGS

In the accompanying drawings forming a material part of this description, there is shown.

DESCRIPTION OF THE PREFERRED EMBODIMENTS

The embodiment discloses the application of the present invention to the formation of silicon nitride sidewall spacers in the manufacture of an integrated circuit device. It should be clear to those experienced in the art that the present invention can be applied and extended without deviating from the scope of the present invention.

Figure 6:
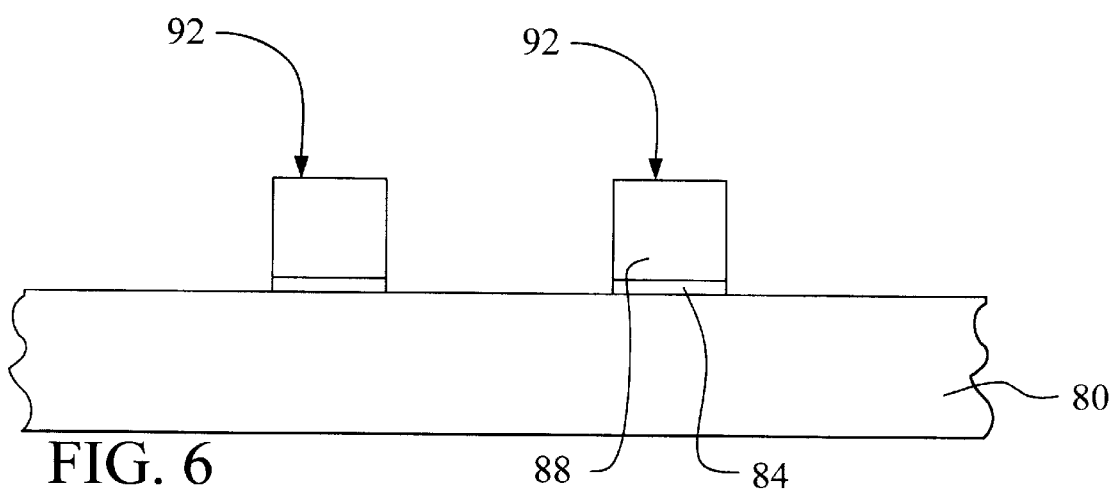
FIGS. 6 through 10 schematically illustrate in cross-sectional representation the preferred embodiment of the present invention.

Referring now particularly to FIG. 6, there is shown a cross section of a partially completed integrated circuit device of the preferred embodiment. In this embodiment, the present invention is used to form silicon nitride sidewall spacers in the fabrication of narrowly-spaced MOSFET transistor gates. Alternatively, the key process steps could be used to create silicon nitride sidewall spacers for a variety of situations where a conductive trace is formed overlying a substrate. A semiconductor substrate 80, typically consisting of monocrystalline silicon, is provided. Two narrowly-spaced transistor gate electrodes 92 are formed overlying the semiconductor substrate 80. Each MOS transistor gate electrode 92 is made up of a gate oxide layer 84 and a polysilicon gate layer 88. Each MOS transistor gate electrode 92 is formed in a conventional way. First, a thin gate oxide layer 84 is either grown or deposited overlying the semiconductor substrate 80. The polysilicon gate layer 88 is then deposited, typically by a chemical vapor deposition (CVD) process, overlying the gate oxide layer 84. The polysilicon gate layer 88 and the gate oxide layer 82 are then patterned to form the individual MOS transistor gate electrodes 92. Additional steps to form, for example, source and drain regions in the semiconductor substrate 80 are not shown for simplicity of illustration.

Figure 7:
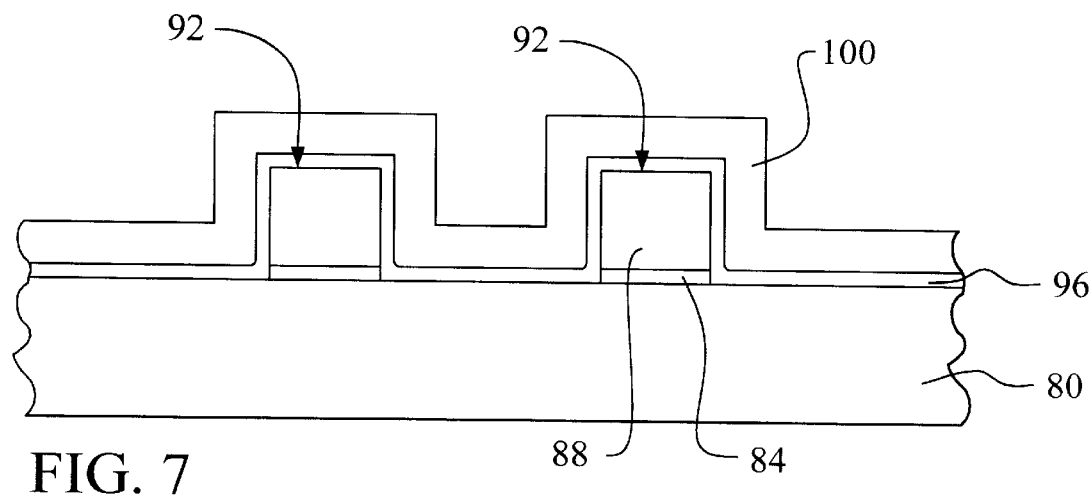

Referring now to FIG. 7, an important aspect of the present invention is shown. A liner oxide layer 96 is grown or deposited overlying the MOS transistor gate electrodes 92 and the semiconductor substrate 80. The liner oxide layer 96 improves the adhesion of the subsequently formed silicon nitride layer 100. The liner oxide layer comprises silicon dioxide that may be formed by a CVD deposition process or by a thermal oxidation. The liner oxide layer preferably has a thickness of between about 50 Angstroms and 250 Angstroms.

A silicon nitride layer 100 is formed overlying the liner oxide layer 96. This is an important feature of the present invention because the sidewall spacer will be formed in this layer. The silicon nitride layer 100 may be formed by a CVD process, as is conventional in the art. In the preferred embodiment, the silicon nitride layer 100 is formed to a thickness of between about 400 Angstroms and 1,000 Angstroms.

Figure 8:
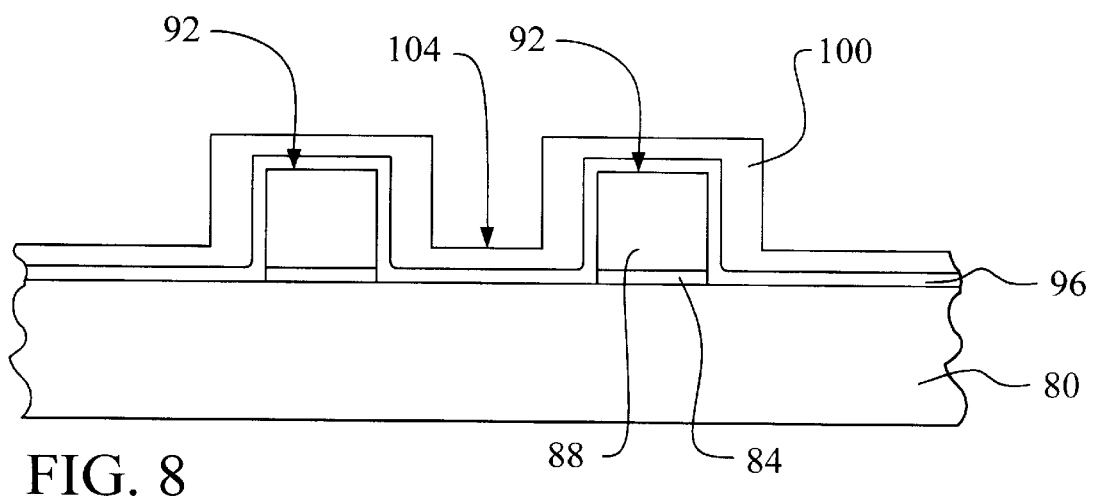

Referring now to FIG. 8, another important feature of the present invention is shown. The silicon nitride layer 100 is anisotropically etched down to reduce the vertical thickness of the silicon nitride layer 100 while not exposing the underlying liner oxide layer 96. The vertical thickness of the silicon nitride layer 100 after this etching step is between about 200 Angstroms and 1,000 Angstroms. The etching step comprises a timed reactive ion etch (RIE) with a fluorine-based chemistry. Particularly, the RIE step chemistry for this step comprises one of the group of: $SF_6$, $NF_3$, $CF_4$, and $CHF_3$.

Figure 9:
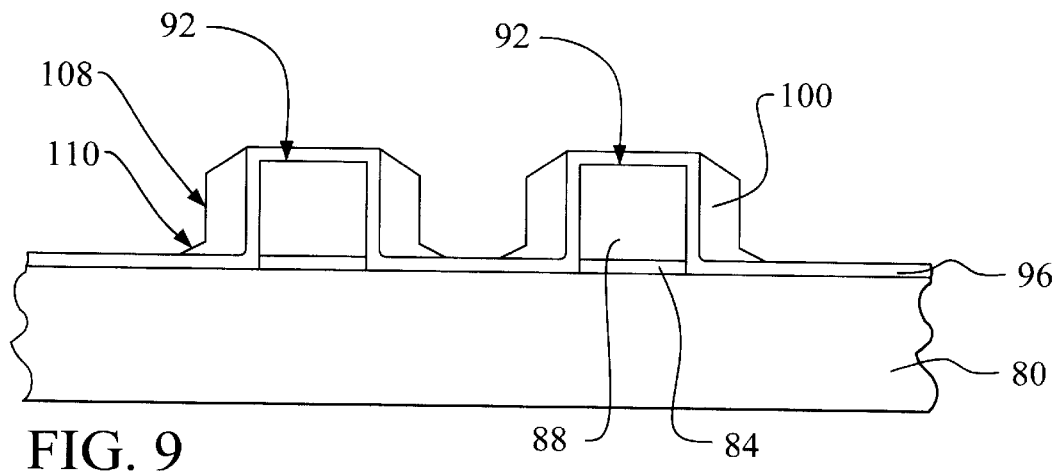

Referring now to FIG. 9, the silicon nitride layer 100 is etched through to form silicon nitride sidewall spacers adjacent to the transistor gate electrodes 92. This etching results in a tapered, L-shaped sidewall profile 108. A RIE is used with an etching chemistry comprising $Cl_2$ and $O_2$ in combination with an inert gas, such as He and Ar. Endpoint detection is used, along with a percentage overetch. The preferable gas flows used in this process comprise: $Cl_2$ flowing at between about 50 sccm and 200 sccm or a molar percentage of between about 30% and 70%, $O_2$ flowing at between about 1 sccm and 10 sccm or a molar percentage of between about 0.5% and 3.5%, and an inert gas flowing at between about 50 sccm and 200 sccm or a molar percentage of between about 30% and 70%.

The process used to etch through the silicon nitride layer 100 generates a rich polymer which accumulates on the sidewall during the etch. This polymer inhibits lateral etching and results in the desired L-shaped sidewall profile. In addition, the anisotropic etching down step of FIG. 8 and the etching through step of FIG. 9 are performed in the same etch chamber as a sequence of insitu processes. This polymer can be removed by post-etch cleaning such as dilute hydrofluoric acid (HF). This cleaning will not affect the silicon nitride sidewalls.

Figure 10:
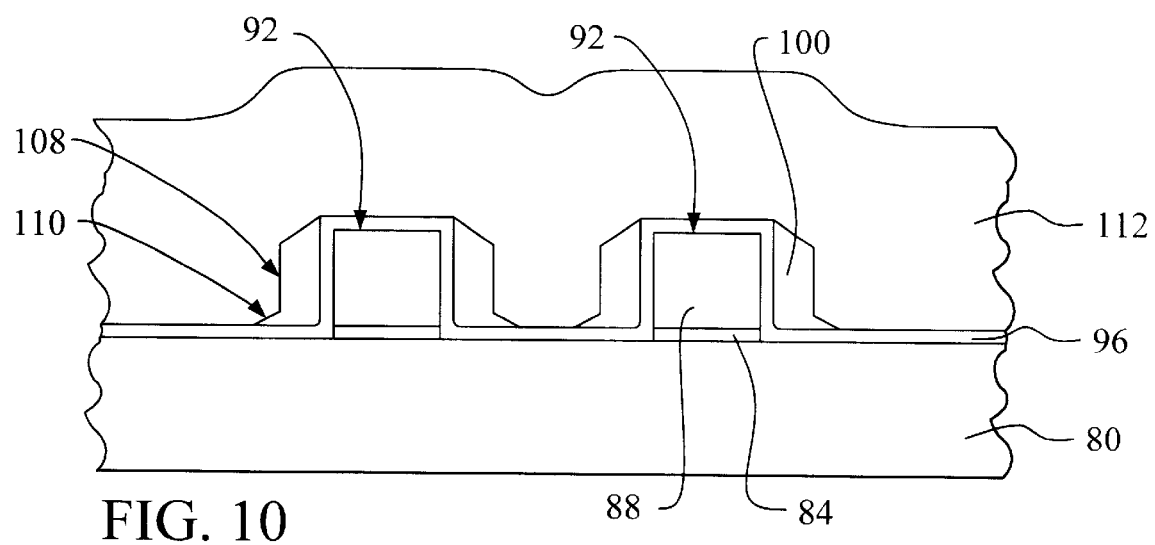

Referring now to FIG. 10, an interlevel dielectric layer 112 is deposited overlying the transistor gates 92, sidewall spacers 100 and the liner oxide layer 96. The interlevel dielectric layer 112 may be silicon dioxide or a low dielectric constant organic or inorganic material.

It is possible to modify the profile 108 of the sidewalls by modifying the process parameters of the present invention. First, the final profile of the silicon nitride sidewalls can be controlled by changing the fixed etch time used in the first, or anisotropic etch down, step of the silicon nitride layer 100. This will change the starting point of the taper portion 110 of the spacer. Second, by modifying the gas flow rates and ratios in the second, or etching through, step, the slope of the taper portion 110 can be altered. If, for example, the first step etch time is decreased, the height of the taper portion 110 will be increased. Alternatively, if the oxygen flow is increased during the second step, the slope of the tapered portion 110 will be reduced.

Figure 1:
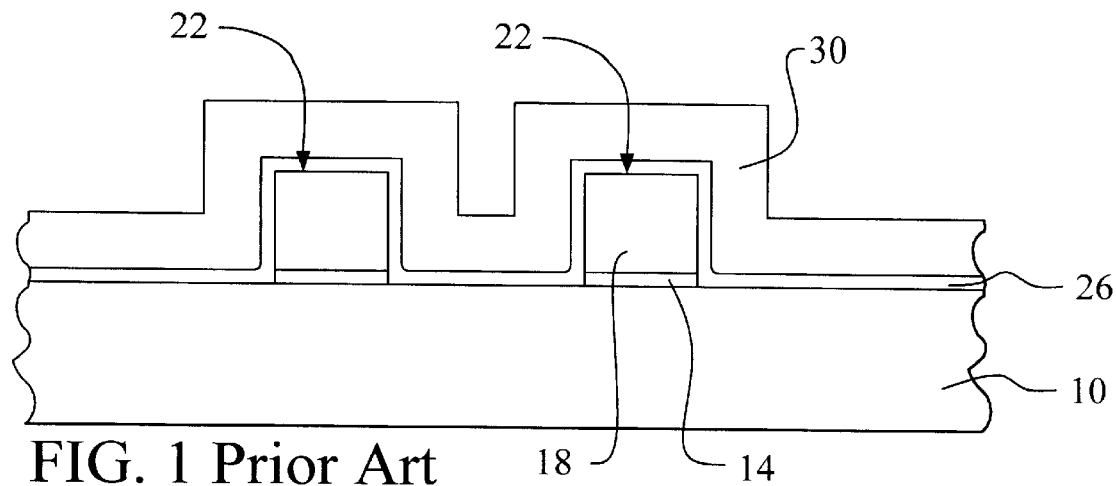
FIGS. 1 through 5 schematically illustrate in cross-section partially completed prior art integrated circuit devices.
Figure 2:
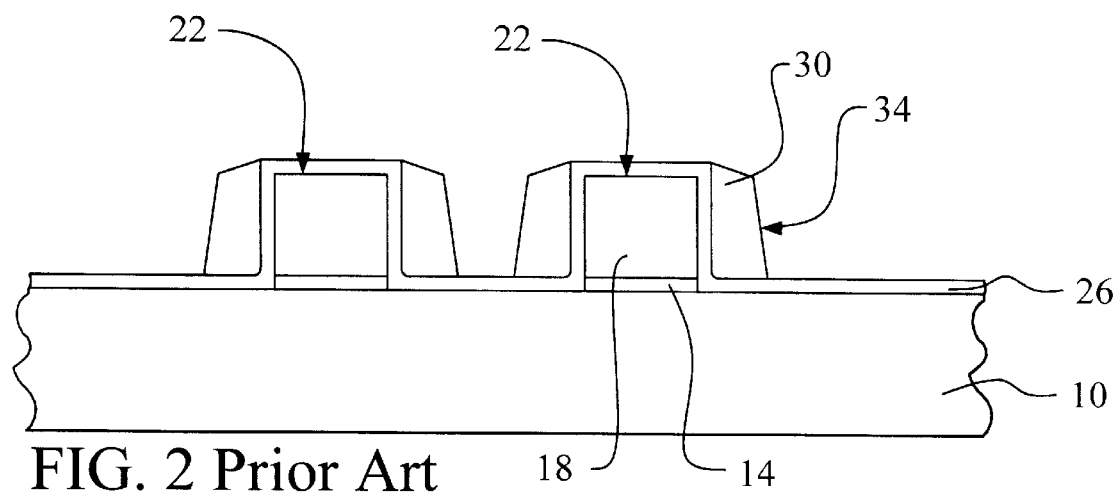

Now the specific advantages of the present invention over the prior art can be listed. Compared with the conventional nitride spacer process shown in FIGS. 1 and 2, there are two advantages to the process of the present invention. First, a thinner silicon nitride layer is required to obtain the desired spacer width. This is very desirable for devices with narrowly-spaced gate electrodes. Second, for the present invention, the width at the top of the spacer is significantly smaller than width at the bottom. This is a significant advantage because the gap between two adjacent spacers is more open and is therefore easier fill with the interlevel dielectric material without creating voids.

Figure 3:
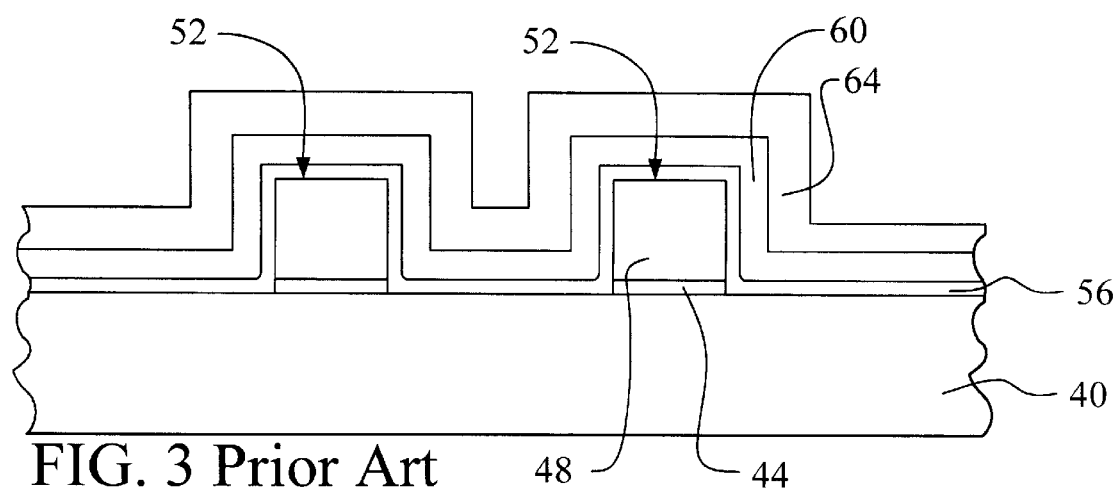
Figure 4:
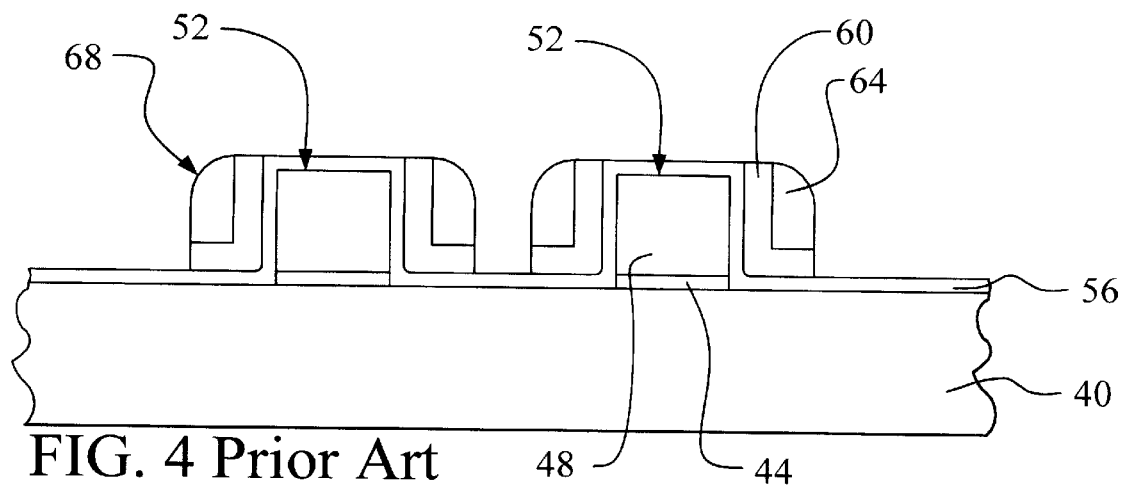
Figure 5:
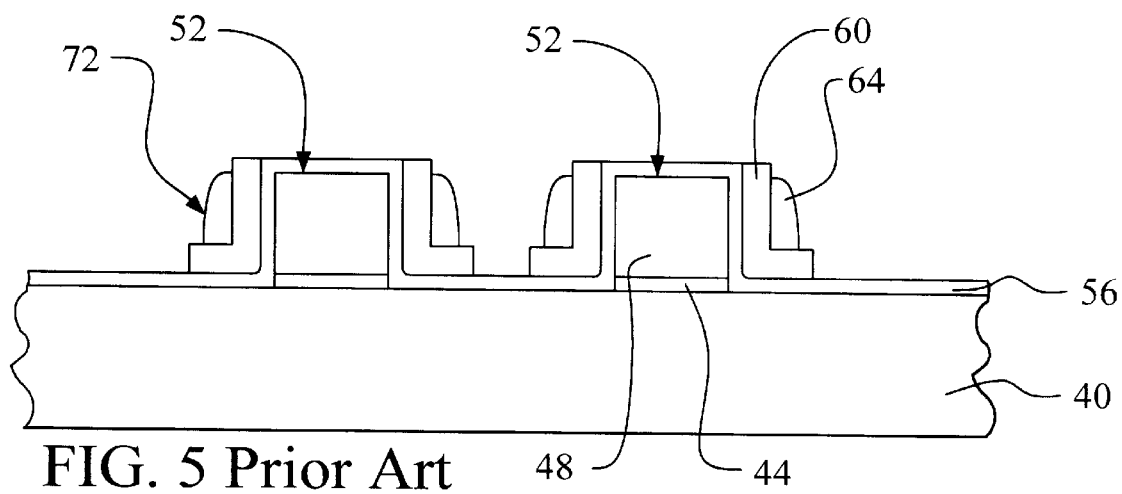

Compared with the prior art L-shaped sidewall spacer method of FIGS. 3 through 5, there are four advantages to the process of the present invention. First, the film stack required to create the spacer is less limited by the available inter-gate electrode space. Second, only a simple film stack is needed, thus saving process cycle time. Third, the exclusion of the second silicon dioxide layer eliminates the additional thermal processing represented by the silicon dioxide deposition step. This added thermal budget could have a detrimental effect upon the previous process layers, specifically the lightly doped drains. The process of the present invention eliminates this concern. Fourth, the spacer shape of the present invention process is more consistent than the shape generated by the prior art approach. The earlier mentioned effect of the wet cleaning step (FIG. 5) is eliminated.

Experimental results confirm the process of the present invention. Scanning electron microscope (SEM) pictures confirm that optimal spacer profiles can be achieved using the process.

As shown in the preferred embodiments, the present invention provides a very manufacturable process for fabricating silicon nitride sidewall spacers in an integrated circuit device. The present invention improves the device density by improving dielectric gap fill between adjacent polysilicon gates or traces. It also represents a distinct improvement on the existing art for silicon nitride space technology.

While the invention has been particularly shown and described with reference to the preferred embodiments thereof, it will be understood by those skilled in the art that various changes in form and details may be made without departing from the spirit and scope of the invention.

What is claimed is:

1. A method to fabricate silicon nitride sidewall spacers in the manufacture of an integrated circuit device comprising:

providing an insulating layer overlying a semiconductor substrate;

providing conductive traces overlying said insulating layer;

forming a liner oxide layer overlying said conductive traces and said insulating layer;

forming a silicon nitride layer overlying said liner oxide layer;

anisotropically etching down said silicon nitride layer to reduce the vertical thickness of said silicon nitride layer while not exposing underlying said liner oxide layer;

thereafter etching through said silicon nitride layer to form silicon nitride sidewall spacers adjacent to said conductive traces; and completing said integrated circuit device.

2. The method according to claim 1 wherein said conductive traces comprise one of the group of: transistor gates and polysilicon traces.

3. The method according to claim 1 wherein said liner oxide layer is deposited to a thickness of between about 50 Angstroms and 250 Angstroms.

4. The method according to claim 1 wherein said silicon nitride layer is deposited to a thickness of between about 400 Angstroms and 1,000 Angstroms.

5. The method according to claim 1 wherein said step of anisotropically etching down said silicon nitride layer to reduce said vertical thickness of said silicon nitride layer is performed using a reactive ion etch with an etching chemistry comprising one of the group of: $SF_6$, $NF_3$, $CF_4$, and $CHF_3$.

6. The method according to claim 1 wherein said step of an anisotropically etching down said silicon nitride layer to reduce said vertical thickness of said silicon nitride layer results in said vertical thickness of said silicon nitride layer of between about 200 Angstroms and 1,000 Angstroms.

7. The method according to claim 1 wherein said step of etching through said silicon nitride layer to form silicon nitride sidewall spacers is performed using a reactive ion etch with an etching chemistry comprising $Cl_2$ and $O_2$ in combination with an inert gas.

8. The method according to claim 1 wherein said silicon nitride sidewall spacers have a tapered, L-shaped profile.

9. The method according to claim 1 wherein said step of anisotropically etching down said silicon nitride layer to reduce the vertical thickness of said silicon nitride layer and said step of etching through said silicon nitride layer to form silicon nitride sidewall spacers are performed sequentially and insitu.

10. A method to fabricate L-shaped silicon nitride sidewall spacers in the manufacture of an integrated circuit device comprising:

providing an insulating layer overlying a semiconductor substrate;

providing conductive traces overlying said insulating layer;

forming a liner oxide layer overlying said conductive traces and said insulating layer;

forming a silicon nitride layer overlying said liner oxide layer;

anisotropically etching down said silicon nitride layer to reduce the vertical thickness of said silicon nitride layer while not exposing underlying said liner oxide layer wherein said anisotropically etching down is performed using a reactive ion etch with an etching chemistry comprising one of the group of: $SF_6$, $NF_3$, $CF_4$, and $CHF_3$;

thereafter etching through said silicon nitride layer to form silicon nitride sidewall spacers adjacent to said conductive traces wherein said etching through is performed using a reactive ion etch with an etching chemistry comprising $Cl_2$ and $O_2$ in combination with an inert gas and wherein said silicon nitride sidewall spacers have an L-shape wherein the width at the top of said spacers is significantly smaller than the width at the bottom of said spacers; and completing said integrated circuit device.

11. The method according to claim 10 wherein said conductive traces comprise one of the group of: transistor gates and polysilicon traces.

12. The method according to claim 10 wherein said liner oxide layer is deposited to a thickness of between about 50 Angstroms and 250 Angstroms.

13. The method according to claim 10 wherein said silicon nitride layer is deposited to a thickness of between about 400 Angstroms and 1,000 Angstroms.

14. The method according to claim 10 wherein said step of a anisotropically etching down said silicon nitride layer to reduce said vertical thickness of said silicon nitride layer results in said vertical thickness of said silicon nitride layer of between about 200 Angstroms and 1,000 Angstroms.

15. The method according to claim 10 wherein said step of anisotropically etching down said silicon nitride layer to reduce said vertical thickness of said silicon nitride layer and said step of etching through said silicon nitride layer to form silicon nitride sidewall spacers are performed sequentially and insitu.

16. A method to fabricate silicon nitride sidewall spacers in the manufacture of an integrated circuit device comprising:

providing an insulating Layer overlying a semiconductor substrate;

providing conductive traces overlying said insulating layer;

forming a liner oxide layer overlying said conductive traces and said insulating layer wherein said liner oxide layer is formed to a thickness of between 50 Angstroms and 250 Angstroms;

forming a silicon nitride layer overlying said liner oxide layer wherein said silicon nitride layer is formed to a thickness of between 400 Angstroms and 1,000 Angstroms;

anisotropically etching down said silicon nitride layer to reduce the vertical thickness of said silicon nitride layer to a thickness of between 200 Angstroms and 1,000 Angstroms while not exposing underlying said liner oxide layer thereafter etching through said silicon nitride layer to form silicon nitride sidewall spacers adjacent to said conductive traces; and completing said integrated circuit device.

17. The method according to claim 16 wherein said step of anisotropically etching down said silicon nitride layer to reduce said vertical thickness of said silicon nitride layer is performed using a reactive ion etch with an etching chemistry comprising one of the group of: $SF_6$, $NF_3$, $CF_4$, and $CHF_3$.

18. The method according to claim 16 wherein said step of anisotropically etching down said silicon nitride layer to reduce said vertical thickness of said silicon nitride layer and said step of etching through said silicon nitride layer to form silicon nitride sidewall spacers are performed sequentially and insitu.

19. The method according to claim 16 wherein said step of thereafter etching through said silicon nitride layer to form silicon nitride sidewall spacers adjacent to said conductive traces is performed using a reactive ion etch with an etching chemistry comprising $Cl_2$ and $O_2$ in combination with an inert gas.

20. The method according to claim 16 wherein said silicon nitride sidewall spacers have a tapered, L-shaped profile.

* * * * *